United States Patent
Kang (10) Patent No.: US 6,853,575 B2
(45) Date of Patent: Feb. 8, 2005

(54) CELL ARRAY OF FERAM

(75) Inventor: Eung-Youl Kang, Ichon-shi (KR)

(73) Assignee: Hynix Semiconductor Inc., Ichon-shi (KR)

( * ) Notice: Subject to any disclaimer, the term of this patent is extended or adjusted under 35 U.S.C. 154(b) by 68 days.

(21) Appl. No.: 10/327,964

(22) Filed: Dec. 26, 2002

(65) Prior Publication Data

US 2003/0214831 A1 Nov. 20, 2003

(30) Foreign Application Priority Data

May 16, 2002 (KR) .......................................... 2002-27112

(51) Int. Cl.[7] .............................................. G11C 11/22
(52) U.S. Cl. ...................................... 365/145; 365/149
(58) Field of Search ................................ 365/145, 149, 365/65

(56) References Cited

U.S. PATENT DOCUMENTS

| | | | |
|---|---|---|---|
| 5,903,492 A | * | 5/1999 | Takashima ................... 365/145 |
| 6,101,119 A | | 8/2000 | Yi et al. |
| 6,178,107 B1 | | 1/2001 | Kang |
| 6,246,616 B1 | | 6/2001 | Nagai et al. |
| 6,307,806 B1 | | 10/2001 | Tomita et al. |
| 6,366,490 B1 | * | 4/2002 | Takeuchi et al. ............. 365/145 |
| 6,493,251 B2 | * | 12/2002 | Hoya et al. .................. 365/145 |
| 6,584,009 B1 | * | 6/2003 | Roehr et al. ................. 365/145 |
| 6,639,824 B1 | * | 10/2003 | Wohlfahrt et al. ........... 365/145 |

FOREIGN PATENT DOCUMENTS

| | | | | |
|---|---|---|---|---|
| JP | 11-102980 | 4/1999 | ....... | H01L/21/8247 |
| KR | 2001-7157 | 1/2001 | ........... | G11C/11/22 |
| KR | 2001-61559 | 7/2001 | ........... | G11C/11/22 |

* cited by examiner

*Primary Examiner*—Tan T. Nguyen
(74) *Attorney, Agent, or Firm*—Piper Rudnick LLP (57) ABSTRACT

A cell array of a NAND type ferro-dielectric memory is disclosed. The cell array of ferro-dielectric memory system, including: a plurality of unit cell strings coupled to one bit line; and a plurality of string selectors between each of the unit cell strings and the bit line, wherein only one unit cell string is connected to the bit line through one string selectors. The present invention can decrease a size of cell by eliminating a bit line contact formed in cells and controls a bit line capacitance by using selection transistor, therefore, the present invention can control optimum bit line capacitance by gaining the maximum sense margin.

10 Claims, 6 Drawing Sheets

CELL ARRAY OF FERAM

FIELD OF THE INVENTION

The present invention relates to a semiconductor device; and, more particularly, to a cell array of a NAND type ferroelectric random access memory.

DESCRIPTION OF RELATED ARTS

Recently, a limitation of refresh in a dynamic random access memory (DRAM) has been overcome by using ferro electric thin film as a dielectric film of a capacitor and it has been caused to increase a capacity of a memory. The ferroelectric Random Access Memory. (FeRAM) is one of nonvolatile memories having ferro electric thin film. It has several advantages such as to nonvolatile and fast access time. Therefore, it has been spotlighted as next generation memory.

Figure 1:
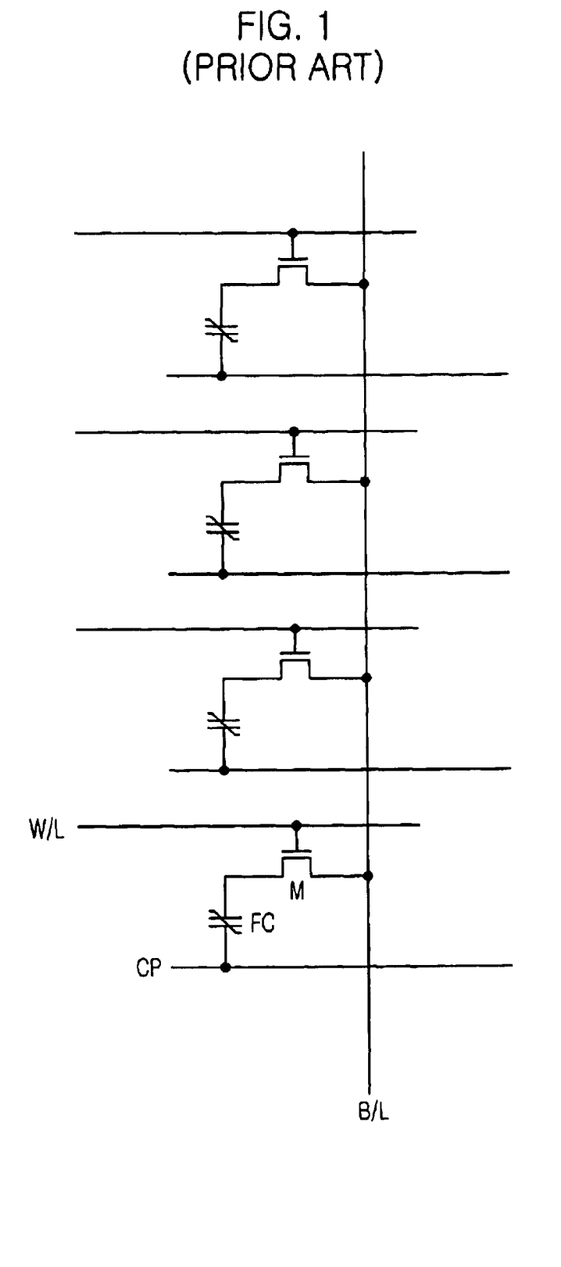
FIG. 1 is a circuit diagram illustrating a conventional cell array of ferroelectric memory.

FIG. 1 is a circuit diagram illustrating a conventional cell array of ferro electric memory.

Referring to FIG. 1, unit cells are arranged at a location where a plurality of word line WL and one bit line BL are crossed. Each unit cell includes a transistor and a ferroelectric capacitor FC. A drain of the transistor is coupled to the bit line BL and a gate of the transistor is coupled to the word line WL. The ferroelectric capacitor FC has a first electrode coupled to a source of the transistor M and a second electrode coupled to a cell plate line CP.

A cell array is consisted of the plurality of the above mentioned unit cells as forming a matrix-type and a cell string is coupled to one bit line.

Since an active area and bit line of the conventional cell array of ferroelectric memory is separated, a bit line contact is necessary in every unit cell to transmit a signal to bit line. Therefore, a predetermined space is required for the bit line contact by considering a contact size, an active area, and an overlap margin of a contact and a word line.

Therefore, there is a limitation to integrate the conventional memory system because-the active area and the bit line are separated in the conventional cell array.

Figure 2:
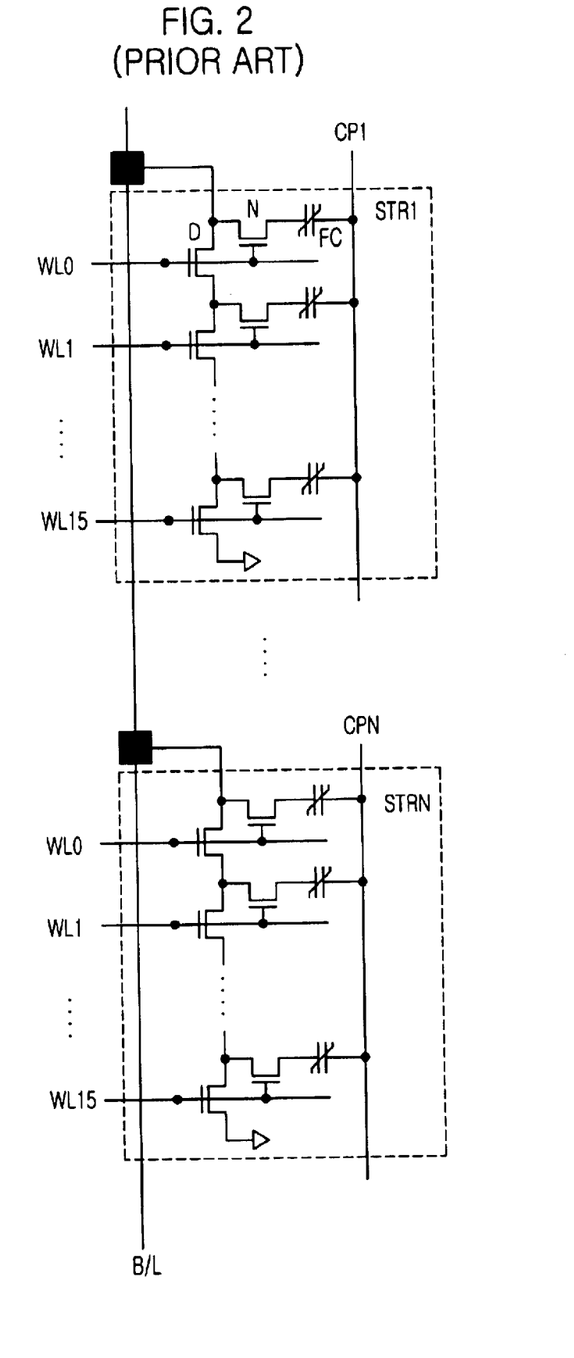
FIG. 2 is a circuit diagram showing another conventional cell array of a NAND type ferroelectric memory.

For overcoming the limitation of the conventional cell array of memory, another conventional cell array of memory is introduced as shown in FIG. 2.

FIG. 2 is a circuit diagram depicting another conventional cell array of a NAND type ferroelectric memory system.

Referring to FIG. 2, the cell array has a plurality of cell strings STR1~STRN and each cell string has same structure.

The cell string includes a plurality of unit cells corresponding to the number of desired bits and each unit cells includes a depletion mode transistor (D), an enhancement mode transistor (N) and a ferro capacitor (FC).

A plurality of enhancement mode transistors is coupled in series. A source of the enhancement mode transistor is coupled to a source of depletion mode transistor and two nodes of capacitor are connected to a drain and a cell plate line, respectively. Gates of the enhancement mode transistor N and the depletion mode transistor D are commonly connected to a word line WL.

Figure 3:
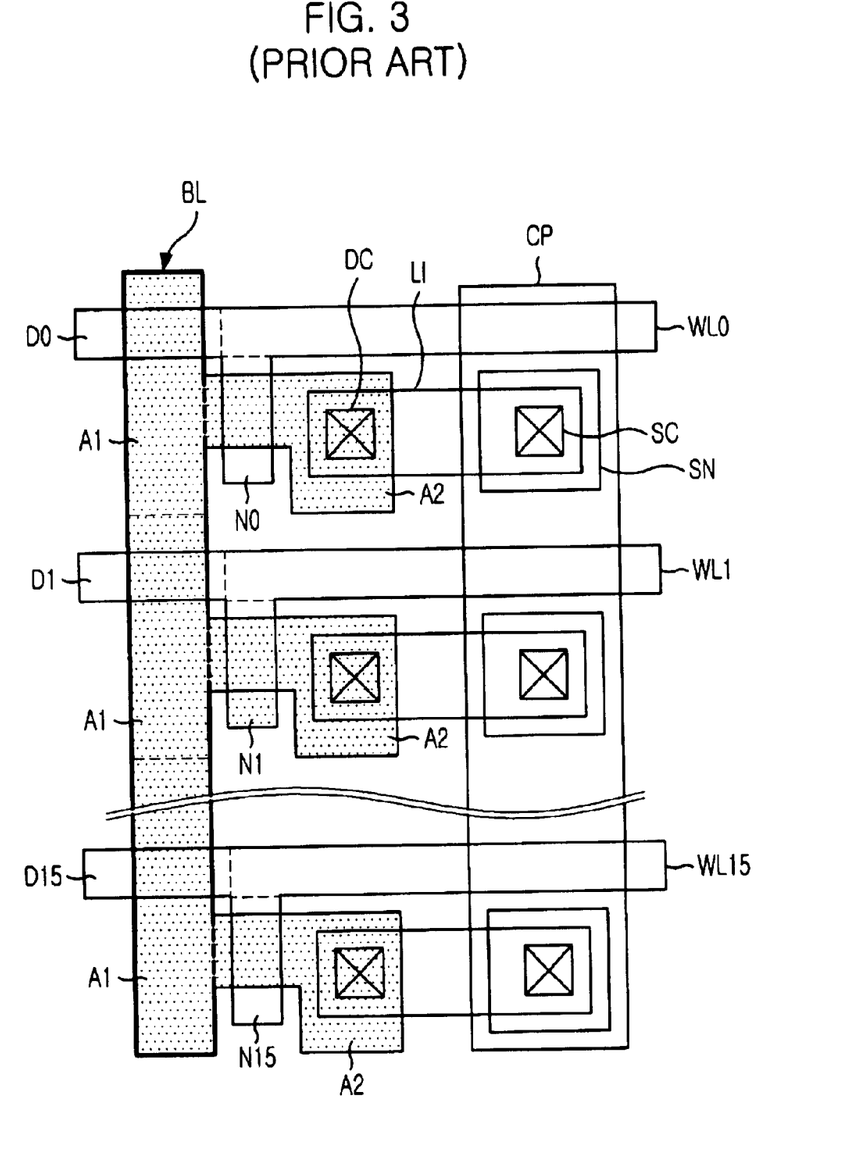
FIG. 3 is a view depicting a lay out of cell array shown in FIG. 2.

FIG. 3 shows a layout of NAND type cell array in FIG. 2.

Referring to the FIG. 3, a cell array includes a first active area A1, a second active area A2, a word line WL, a storage node contact electrode SN and a ferroelectric capacitor FP.

Gates D0, D1, . . . D15 are passed over the first active area A1. The second active area A2 is coupled one side of the active area A1 and gates of the enhancement mode transistor N0, N1, . . . N15 is passed over the second active area A2. The word line WL is coupled to the gates of depletion mode transistor D0, D1, . . . , D15 and gate of the enhancement mode transistor N0, N1, . . . , N15. A ferro electric capacitor includes a storage node contact electrode SC contact electrode coupled to a drain of the enhance mode transistor through a drain contact and a cell plate electrode, coupled to a cell plate line.

In a meantime, the storage node contact electrode SN of the ferroelectric capacitor and the second active area A2 are electrically coupled by a local wiring L1 between the drain contact DC exposing the second active area A2 and the storage node contact electrode SC exposing the storage node contact electrode SN.

Therefore, the storage node contact electrode SN of the ferroelectric capacitor is coupled to a drain of the enhancement mode transistor and the cell plate line of the ferroelectric capacitor is paralleled with the bit line BL.

In the conventional array cells shown in the FIGS. 2 and 3, a unit cell string is composed by combining unit cells. The unit cells include two transistors and one ferroelectric capacitor. The unit cell strings STR1~STRN are coupled to the bit line for transmitting data to a sense amplifier S/A. When a specific ferroelectric capacitor is selected, a capacitance of bit line coupling to the specific ferroelectric capacitor includes a junction capacitance of whole active area included in the unit cell string and a junction capacitance of active area in another unit cell string coupled to selected bit line.

Therefore, if a capacitance of whole bit line is increased a lot, it is too difficult to gain an optimized sense margin, which is required to a ferroelectric memory.

In other words, an active area of the FeRAM adopting NAND type cell array structure is formed lengthwise comparing to the cell array of the typical ferroelectric memory and as a result, the size of the active area becomes increased and also a junction capacitance and a bit line capacitance are increased too. Therefore, the-sense margin cannot be used at an optimize point.

Figure 4:
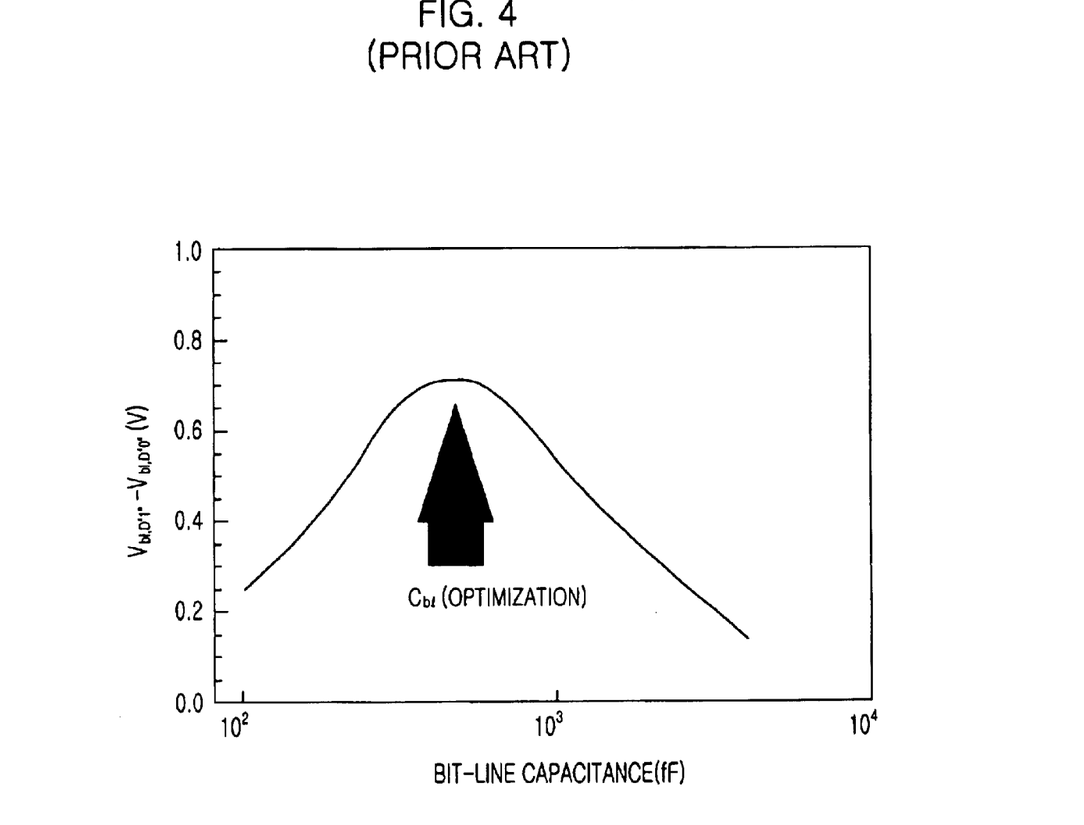
FIG. 4 is a graph explaining a relation between a bit line capacitance and a sense margin in a ferroelectric memory of a preferred embodiment of the present invention.

FIG. 4 is a graph showing a relation between a bit line capacitance and a sense margin in a ferroelectric memory.

Conventionally, a ferroelectric memory uses polarization value of ferroelectric having a hystericsys curve characteristic. In case of DRAM using a linear capacitance, a sense margin increases linearly according to a capacitance of the bit line. However, in case of the ferroelectric memory device using hysterisys curve characteristic, the sense margin increases corresponding to decrease of the capacitance of bit line for while and then the sense margin decreases again.

As shown in a conventional memory of FIG. 1, if one bit line is connected to all unit cells, the capacitance of bit line is increased and it becomes larger than optimum bit line capacitance Cb1. It is a reason of decreasing the sense margin.

SUMMARY OF THE INVENTION

It is, therefore, an object of the present invention to provide a cell array of ferroelectric memory for constraining reduction of a sense margin caused by increase of a bit line capacitance.

It is another object of the present invention to provide a cell array of ferroelectric memory for gaining the optimum sense margin by controlling the bit line capacitance.

In accordance with an aspect of the present invention, there is provided a cell array of ferro-dielectric memory system, including: a plurality of unit cell strings coupled to one bit line; and a plurality of string selector, each of which is arranged between each of the unit cell strings and the bit line, wherein one of the string selector couples corresponding unit cell strings to the bit line by selecting said one of string selector.

In accordance with an aspect of the present invention, there is also provided a cell array of ferro-dielectric memory, including: a first active area being arranged in one direction and used as a bit line; a gate of a depletion mode transistor crossed over the first active area; a second active area being perpendicularly arranged to the first active area and coupled to one side of the first active area; a gate of an enhancement mode transistor crossed over the second active area; a word line coupled to the gate of the enhancement mode transistor and extended from the gate of the depletion mode transistor; a third active area extended from other side of the first active area; a gate of selection transistor being arranged in parallel with the word line and crossed over the first active area; a ferro capacitance coupled to one side of the second active area; and a cell plate line coupled to the ferroelectric capacitor and being arranged in parallel with the first active area.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 5:
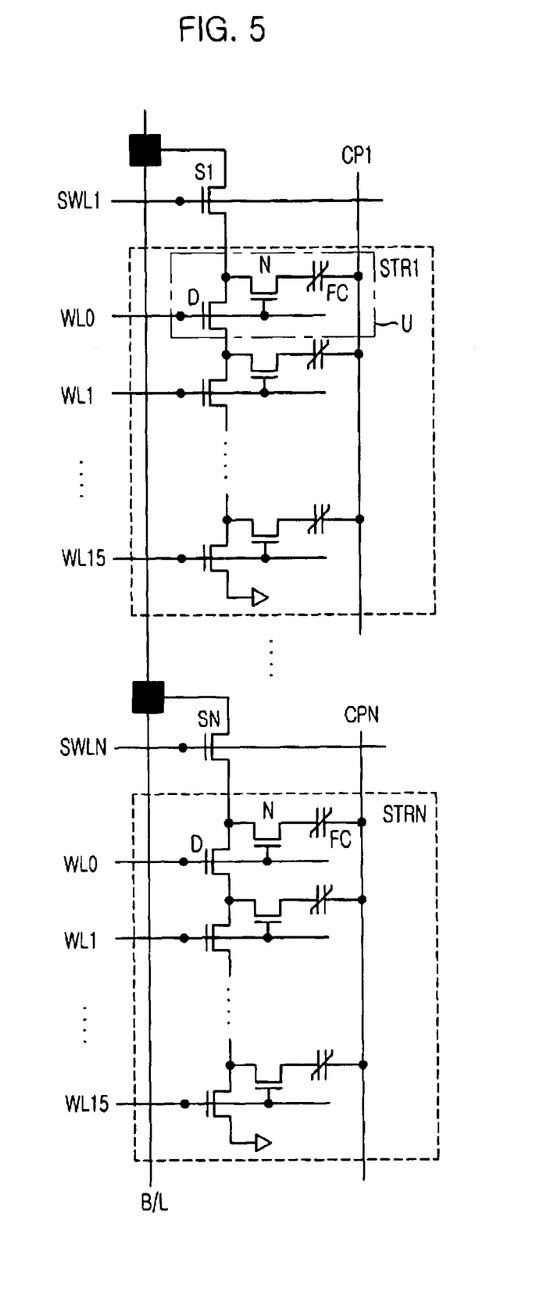
FIG. 5 is a circuit diagram illustrating a cell array of a ferroelectric memory in accordance with a preferred embodiment of the present invention.
Figure 6:
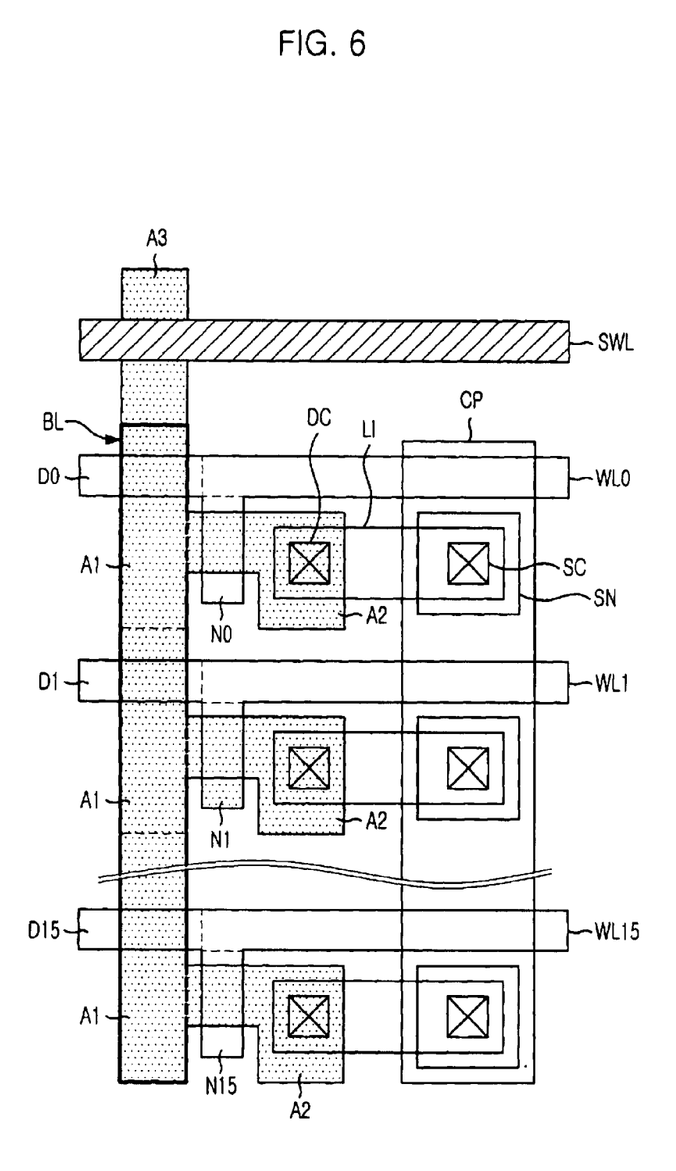
FIG. 6 is a diagram showing a lay out of the cell array of a ferroelectric memory in accordance with the preferred embodiment of the present invention.

FIG. 5 is a circuit diagram illustrating a cell array of a ferroelectric memory in accordance with a preferred embodiment of the present invention and FIG. 5 is a diagram showing a lay out of the cell array of a ferroelectric memory in accordance with the preferred embodiment of the present invention.

Referring the FIG. 4, one bit line BT is coupled to a plurality of unit cell strings STR1 to STRN and each of unit cell strings includes a plurality of unit cell having two transistors and one ferroelectric capacitor. Selection transistors S1 to SN couples each of unit cell string STR1 to STRN and a bit line BL. Cell plate lines CP1 to CPN are coupled to each of unit cell strings.

Two types of transistors are used in the unit cell string. One is a depletion mode transistor (D). The depletion mode transistor (D) is coupled to a plurality of depletion mode transistors (D) in other unit cell strings in series. A gate of the depletion mode transistor is couple to a word line. Other transistor is an enhancement transistor (N) having a source end coupled to a source end of the depletion mode transistor (D) and a drain coupled to one electrode of the ferroelectric capacitor. Other electrode of the ferroelectric capacitor is coupled to the cell plate line CP. The gates of the enhancement mode transistor (N) and the depletion mode transistor (D) are commonly connected to a word line (WL).

FIG. 6 is a lay out diagram of FIG. 5.

Referring to FIG. 6, a plurality of first active areas A1 in the unit cell string form the bit line (BL) and a second active area A2 is formed by being coupled to one side of the first active area A1.

As showing in FIG. 6, the first active area A1 and the second active area A2 are perpendicularly arranged. The first active area A1 forms a line by being coupled to other first active areas of neighbor unit cells in series. The second active area A2 is formed like a branch from the first active area A1 by being coupled one side of the first active area A1 in a direction perpendicular to the bit line BL. The line formed with the first active areas is used as a bit line.

One end of the first active area A1, which is an end of the bit line, is coupled to a third active area A3. A gate (SWL) of a selection transistor S1 passes over the third active area A3. The selection transistor (S1) is used to select only STR1 among-unit cell strings STR1 to STRN.

Gates D0 to D15 of depletion mode transistors are passed over the first active area A1, which forms the bit line, and gates N1 to N15 of enhancement transistors are passed over junction points of the first active areas and the second active areas A2. The gates D0 to D15 of depletion mode transistors and gates N0 to N15 of enhancement transistors are coupled to a plurality of word lines WL0 to WL15. The plurality of word lines are crossed with one bit line.

The third active area A3 is an active area of the selection transistor. The selection transistor (S1) has a source coupled to a common source of the depletion mode transistor D and enhancement transistor N. A drain of the selection transistor is coupled to the bit line and a gate of the selection transistor receives a select signal SWL1.

As mentioned above, the unit cell string STR1 is separated from a bit line contact by controlling on/off of the selection transistor S1 arranged between the unit cell string and the bit line BL.

The present invention uses an active bit line for reducing a loss of cell size caused by forming a bit line above an active area. The active bit line is also used for coupling active areas of cells.

When the active area is used as the bit line, data can be transmitted through the bit line, if all of the word lines WL0 to WL15 are selected. However, if all the word lines are selected, random accesses of memory cell become impossible. Therefore, for transmitting data without selecting all word lines, the active bit line must be formed with the depletion mode transistor on the active area of each unit cell. The depletion mode transistor always maintains ON state. By implementing the depletion mode transistor's characteristic, the data passed to the bit line can be transmitted to a sense amplifier in case of "high" by selecting the word line or "low" by not selecting the word line.

By implementing the depletion mode transistor, as mentioned above, a bit line contact is no more necessary to be formed in each unit cell. Therefore, an area occupied by the bit line contact, which is required at a contact design rule, can be eliminated. Furthermore, the bit line and cell plate line also are formed in parallel, therefore, an area occupied by a cell plate driver can be eliminated too. As a result, it is possible to decrease a ward line delay.

Operations of the cell array of the ferroelectric memory shown in FIG. 5 are explained as below.

In case of selecting a unit cell U, in a unit cell string STR1, a selection transistor S1 is turned on by applying high state of a selection signal SWL1 among the selection signals SWL1 to SWLN. As the selection transistor S1 is turned on, only the unit cell string STR1 is selected among unit cell strings coupled to the same bit line BL. The above-mentioned operation is for maintaining the bit line in a ground state during bit line pre-charging.

Next, in case of stand-by mode, all word lines WL0 to WL15 are maintained as low. The word lines WL0 to WL15 are still maintained as low during bit line pre-charging. After pre-charging, a word line 'WL1' is maintained as 'High' and any other word lines are maintained as 'Low'. At this time, a cell plate line CP1 is maintained as 'High' by selecting the cell plate line CP1. The depletion mode transistor 'D' and enhancement transistor 'N' becomes turned on in case that the word line 'WL1' is high, therefore, data of selected ferroelectric capacitor is transmitted to a sense amplifier through the bit line. However, other enhancement transistors of unit cells N0 and. N2 to N15 becomes turned off so data cannot be transmitted trough the bit line. After transmitting the data, the cell plate line CP1 becomes 'Low' and the word line is off.

As mentioned above, the unit cell of the present invention is operated identically comparing with the conventional FeRAM or DRAM. That is, reading and writing methods are identical. The depletion mode transistor is used for forming bit line with the active area.

Processing steps of implementing the cell array of the present invention is very similar to convention processing step, therefore, detailed explanation of processing step is omitted. The depletion mode transistor and the enhancement mode transistor can be formed by exposing each of areas for depletion mode transistor and enhancement mode transistor and then implementing ion to the exposed areas. Another method produces the cell array by exposing each of areas for depletion mode transistor and enhancement mode transistor and performing implementation of ion for the depletion mode transistor first. After implementing ion for the deletion mode transistor, the area of the enhancement mode transistor is exposed and compensation ion implementation is performed for enhancement mode transistor.

As mentioned above, the present invention decreases the capacitance of the bit line shared within one cell by additionally equipping the selection transistor when the cell unit of the ferroelectric memory is being operated by additionally equipping the selection transistor. The bit line capacitance includes junction capacitances related to the unit cell string, a parasitic capacitance, a capacitance of a bit line contact area and a capacitance contained in the sense amplifier. As above mentioned, capacitances of the bit line can be decreased by the present invention.

By decreasing capacitance of the bit line, a length of unit cell string can be extended. That is, the number of unit cell string is conventionally limited as 16 to 32, however, in the present invention, the number of unit cell strings can be extended to a range of 64 to 256 by considering characteristics of ferroelectric or CMOS transistor.

Therefore, in case of the ferroelectric memory, an amount of bit line capacitance needs to be controlled for gaining optimum sense margin. That is, the capacitance of the bit line needs be controlled according to the number of cells coupled to the bit line for maintaining appropriately the value of the capacitance.

As mentioned above, the present invention can decrease a size of unit cell by eliminating the bit line contact in the unit cells. Also, the present invention can reduce the bit line capacitance by controlling the selection transistor. Therefore, the present invention can control the optimum bit line capacitance, thereby gaining the maximum sense margin.

And, since the present invention uses the active area as the bit line, a contact is not required to be formed in each unit cell and only line formed by an active area is required. Therefore, the present invention also decrease a size of memory system by eliminating the bit line contact required in a contact design rule.

Moreover, the present invention can decrease a delay caused by the word line by eliminating an area used as a cell plate driver since the bit line and the cell plate line are formed in parallel.

While the present invention has been described with respect to certain preferred embodiments, it will be apparent to those skilled in the art that various changes and modifications may be made without departing from the scope of the invention as defined in the following claims.

What is claimed is:

1. A cell array of ferroelectric memory, comprising:
   a plurality of unit cell strings coupled to one bit line; and
   a plurality of string selecting means between each of the unit cell strings and the bit line, wherein only one unit cell string is connected to the bit line through one string selecting means, wherein, the unit cell string includes a plurality of unit cells containing a depletion mode transistor and an enhancement mode transistor, which have a source commonly coupled to the string selecting means and a gate for commonly receiving a signal; and a capacitor, which has an end coupled to a drain of the enhancement mode transistor and another end coupled to a cell elate line, wherein the unit cells are coupled in series through the depletion mode transistors.

2. The cell array as recited in claim 1, wherein the string selecting means is a transistor including an end coupled to the bit line and other end coupled to the unit cell string.

3. A cell array of ferroelectric memory, comprising:
   a first active area being arranged in one direction and used as a bit line;
   a depletion mode transistor including a gate crossed over the first active area;
   a second active area coupled to one side of the first active area;
   a gate of an enhancement mode transistor including a gate crossed over the second active area;
   a word line coupled to the gate of the enhancement mode transistor and extended from the gate of the depletion mode transistor;
   a third active area extended from other side of the first active area;
   a selection transistor including a gate crossed over the first active area;
   a ferroelectric capacitor coupled to one side of the second active area; and
   a cell plate line coupled to the ferroelectric capacitor.

4. The cell array as recited in claim 3, wherein the first active area being formed as the bit line by being coupled with the first active areas of neighbor cells in series.

5. The cell array as recited in claim 3, wherein the second active area being coupled to one end of the ferroelectric capacitor through a local wire.

6. The array as recited in claim 3, wherein a plurality of unit cells are formed by the first active area and the second active area in order to form a unit cell string.

7. The cell array as recited in claim 6, wherein the plurality of unit cells are connected to each other through the first active area.

8. The cell array as recited in claim 3, wherein the second active area is perpendicularly arranged to the first active area.

9. The cell array as recited in claim 3, wherein the selection transistor is arranged in parallel with the word line.

10. The cell array as recited in claim 3, wherein the cell plate line is arranged in parallel with the first active area.

* * * * *